US012805311B2

(12) United States Patent
Choi

(10) Patent No.: US 12,805,311 B2
(45) Date of Patent: Nov. 17, 2026

(54) SEMICONDUCTOR PACKAGE

(71) Applicant: JMJ Korea Co., Ltd., Busan (KR)

(72) Inventor: Yun Hwa Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 379 days.

(21) Appl. No.: 18/144,236

(22) Filed: May 7, 2023

(65) Prior Publication Data

US 2024/0178094 A1 May 30, 2024

(30) Foreign Application Priority Data

Nov. 28, 2022 (KR) ........................ 10-2022-0161181

(51) Int. Cl.

| | |
|---|---|
| ***H10W 40/22*** | (2026.01) |
| ***H10W 40/25*** | (2026.01) |
| ***H10W 70/65*** | (2026.01) |
| ***H10W 90/00*** | (2026.01) |
| *H10W 72/00* | (2026.01) |

(52) U.S. Cl.

CPC ......... *H10W 40/22* (2026.01); *H10W 40/226* (2026.01); *H10W 40/258* (2026.01); *H10W 70/65* (2026.01); *H10W 90/701* (2026.01); *H10W 72/871* (2026.01); *H10W 72/884* (2026.01); *H10W 72/886* (2026.01); *H10W 90/734* (2026.01); *H10W 90/754* (2026.01); *H10W 90/764* (2026.01)

(58) Field of Classification Search

CPC ............. H01L 23/3675; H01L 23/3672; H01L 23/3736; H01L 23/49811; H01L 23/49838; H01L 24/32; H01L 24/40; H01L 24/48; H01L 24/73; H01L 2224/32225; H01L 2224/40227; H01L 2224/48227; H01L 2224/73221; H01L 2224/73263; H01L 2224/73265; H01L 2924/13055; H01L 2924/13091; H01L 23/24; H01L 23/3735; H01L 23/473; H01L 24/29; H01L 24/37; H01L 24/45; H01L 24/49; H01L 24/84; H01L 23/367; H01L 23/10

See application file for complete search history.

(56) References Cited

U.S. PATENT DOCUMENTS

| | | | | |
|---|---|---|---|---|
| 2018/0033711 | A1* | 2/2018 | Hartung | H01L 23/3735 |
| 2019/0067214 | A1* | 2/2019 | Sato | H01L 23/36 |
| 2019/0221449 | A1* | 7/2019 | Trichy Rengarajan | H01L 23/24 |
| 2022/0230891 | A1* | 7/2022 | Fedi | H01L 23/3675 |
| 2023/0253275 | A1* | 8/2023 | Higashi | H01L 23/3121 257/690 |
| 2023/0360990 | A1* | 11/2023 | Shafiyan-Rad | H01L 23/055 |

(Continued)

FOREIGN PATENT DOCUMENTS

| | | |
|---|---|---|
| JP | 2016-072281 A | 5/2016 |
| JP | 2016-181536 A | 10/2016 |

(Continued)

*Primary Examiner* — Jeff W Natalini
*Assistant Examiner* — Nicholas Leland Hutson
(74) *Attorney, Agent, or Firm* — Park, Kim & Suh, LLC

(57) ABSTRACT

Provided is a semiconductor package in which a heat radiation substrate and a housing are separately formed and are bonded to each other through an insulating layer or an adhesive member so that a manufacturing process thereof is suitable for mass-production and thereby, productivity may be increased.

15 Claims, 8 Drawing Sheets

(56) References Cited

U.S. PATENT DOCUMENTS

| | | | | |
|---|---|---|---|---|
| 2024/0006256 | A1* | 1/2024 | Ashida | H01L 23/4006 |
| 2024/0038632 | A1* | 2/2024 | Prajuckamol | H01L 23/3735 |
| 2024/0421132 | A1* | 12/2024 | Tsuchimochi | H01L 23/24 |

FOREIGN PATENT DOCUMENTS

| | | | |
|---|---|---|---|
| JP | 2019-040971 | A | 3/2019 |
| KR | 10-2013-0060613 | A | 6/2013 |
| KR | 10-2014-0077561 | A | 6/2014 |
| KR | 10-2015-0031029 | A | 3/2015 |
| KR | 10-2015-0046962 | A | 5/2015 |
| KR | 10-1694657 | B1 | 1/2017 |
| KR | 10-1899788 | B1 | 11/2018 |
| KR | 10-1920915 | B1 | 11/2018 |
| KR | 10-2411122 | B1 | 6/2022 |

* cited by examiner

SEMICONDUCTOR PACKAGE

CROSS-REFERENCE TO RELATED PATENT APPLICATION

This application claims the benefit of Korean Patent Application No. 10-2022-0161181, filed on Nov. 28, 2022, in the Korean Intellectual Property Office, the disclosure of which is incorporated herein in its entirety by reference.

BACKGROUND OF THE INVENTION

1. Field of the Invention

The present invention relates to a semiconductor package, and more particularly, to a semiconductor package in which a manufacturing process thereof is suitable for mass-production in such a way that a heat radiation substrate and a housing are separately formed and are bonded to each other through an insulating layer or an adhesive member.

2. Description of the Related Art

In general, a semiconductor package includes a semiconductor chip installed on a lower substrate and/or an upper substrate, a conductor which is a metal post functioning as a spacer bonded on the semiconductor chip, a lead frame for applying an electrical signal from the outside, a package housing molded by a sealing member, and a heat release post formed and exposed on the lower substrate and/or the upper substrate. When the package housing is molded, a mold avoids the heat release post formed uprightly on the lower substrate and/or the upper substrate and instead, only presses a part of each heat release metal layer, for example, edges thereof, so that the package housing is formed.

When the package housing is formed as described above, pressurization from the mold is not uniform and pressure applied to the heat release metal layer weakens. Accordingly, a molding resin overflows into the heat release metal layer so as to contaminate the substrate and to affect stability of the semiconductor package.

In this regard, there is a need to prevent contamination of a substrate occurring due to a molding resin by uniformly pressing a mold so as to stably perform molding, to enlarge a contact area by applying various forms and structures of radiation fins so as to improve heat conductivity and heat rejection rate using direct cooling by a coolant, and to improve a structural bonding process of a package housing and a substrate so as to improve productivity.

SUMMARY OF THE INVENTION

The present invention provides a semiconductor package in which a manufacturing process thereof is suitable for mass-production and thereby, productivity may be increased in such a way that a heat radiation substrate and a housing are separately formed and are bonded to each other through an insulating layer or an adhesive member.

According to an aspect of the present invention, there is provided a semiconductor package including: a heat radiation substrate; one or more insulating layers disposed on the heat radiation substrate; one or more metal pattern layers disposed on the insulating layers; a housing disposed on the insulating layer; one or more semiconductor chips installed on the metal patter layers; electrically connecting members for electrical connection between the metal pattern layers and the semiconductors chip or between each of a plurality of semiconductor chips, if the semiconductor chip is in a plural number; one or more terminals formed uprightly on the metal pattern layers; and a molding sealing member molded to cover the semiconductor chips, the electrically connecting members, and at least a part of the terminals, wherein a thickness of the housing is greater than a thickness of the metal pattern layer and at least one terminal is formed to be higher than the upper end surface of the housing so that the upper ends of the at least one terminal are exposed to the upper part of the molding sealing member and thereby, are electrically bonded to external electrical connecting members.

According to another aspect of the present invention, there is provided a semiconductor package including: a heat radiation substrate; an adhesive member disposed on the heat radiation substrate; an insulating substrate which is disposed on the adhesive member and includes one or more insulating layers; a housing disposed on the adhesive member; one or more semiconductor chips installed on the insulating substrate; electrically connecting members for electrical connection between the insulating substrate and the semiconductors chips or between each of a plurality of semiconductor chips, if the semiconductor chip is in a plural number; one or more terminals formed uprightly on the insulating substrate; and a molding sealing member molded to cover the semiconductor chips, the electrically connecting members, and at least a part of the terminals, wherein a thickness of the housing is greater than a thickness of the insulating substrate and at least one terminal is formed to be higher than the upper end surface of the housing so that the upper ends of the at least one terminal are exposed to the upper part of the molding sealing member and thereby, are electrically bonded to external electrical connecting members.

Here, the heat radiation substrate may include a metal material and radiation fins may be arranged on the bottom surface of the heat radiation substrate in a specific pattern.

Also, the heat radiation substrate or the housing may be formed of a single material including Al or Cu or an alloy material containing 50% or more of any one of Al and Cu.

Also, more than 30% of the total surface area of the heat radiation substrate may be plated.

Also, the insulating layer may include one or more metal layers on the lower surface thereof.

Also, the insulating substrate may include one or more insulating layers and one or more metal layers formed on the upper surface, the lower surface, or both upper and lower surfaces of the insulating layer.

Also, the adhesive member may be formed of a soldering material containing Sn or a conductive material containing 50% or more of any one of Ag and Cu.

Also, the insulating layers formed on the lower surface of the housing and the lower surface of the metal pattern layer may be formed of the same material.

Also, the insulating layers may be disposed on the heat radiation substrate in a paste or film form and may be hardened on the heat radiation substrate through a hardening process.

Also, the electrically connecting members may be formed of a material containing 50% or more of any one of Au, Al, and Cu.

Also, the molding sealing member may be a composite material containing an epoxy component or an insulator containing a Si component.

Also, the upper ends of one or more terminals may be formed as a female screw and the external electrical connecting members may be formed as a male screw which are bolt-joined to the upper ends of the terminals so that the terminals and the external electrical connecting members may be electrically connected to each other.

Also, the ends of one or more terminals may be formed to join a press fit pin terminal and may be electrically connected to the external electrical connecting members.

Also, the heat radiation substrate may include one or more wave-formed metal plates structurally bonded to the lower surface thereof.

Also, the heat radiation substrate may include a cover covering more than 50% of the total area of the molding sealing member formed on the upper part thereof.

Also, the heat radiation substrate may include a cooling system structurally joined thereto and a substrate bonding member used for a water-tight coolant may be formed on a joined surface between the heat radiation substrate and the cooling system.

Also, the heat radiation substrate may include a cooling system structurally joined thereto, and the heat radiation substrate and the cooling system may be bonded to each other by using friction stir welding (FSW) so that a coolant of the cooling system may be water-tight.

Also, the heat radiation substrate may be formed of a metal material, the housing formed of a metal material may be formed to cover the sides of the molding sealing member and may have a structure in which the upper part thereof is opened, and a cover including penetration holes thereon to expose the terminals may be prepared on the upper part of the heat radiation substrate so as to cover the molding sealing member and to be bonded to the upper part of the housing.

Also, the semiconductor package may further include a first adhesive member disposed on a first region of the heat radiation substrate and a second adhesive member disposed on a second region of the heat radiation substrate. The heat radiation substrate may be formed of a metal material, the housing may be formed of a metal material, the insulating substrate may be formed on the first adhesive member, the housing may be formed on the second adhesive member, the second region may be an outer edge of the heat radiation substrate, the first regions may be an inner region surrounded by the second region, the first and second adhesive members may be formed of a soldering or sintering material containing a metal component, the housing may be formed to cover the sides of the molding sealing member and has an opened upper part, and a cover including penetration holes thereon to expose the terminals may be prepared on the upper part of the heat radiation substrate so as to cover the molding sealing member and to be bonded to the upper part of the housing.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
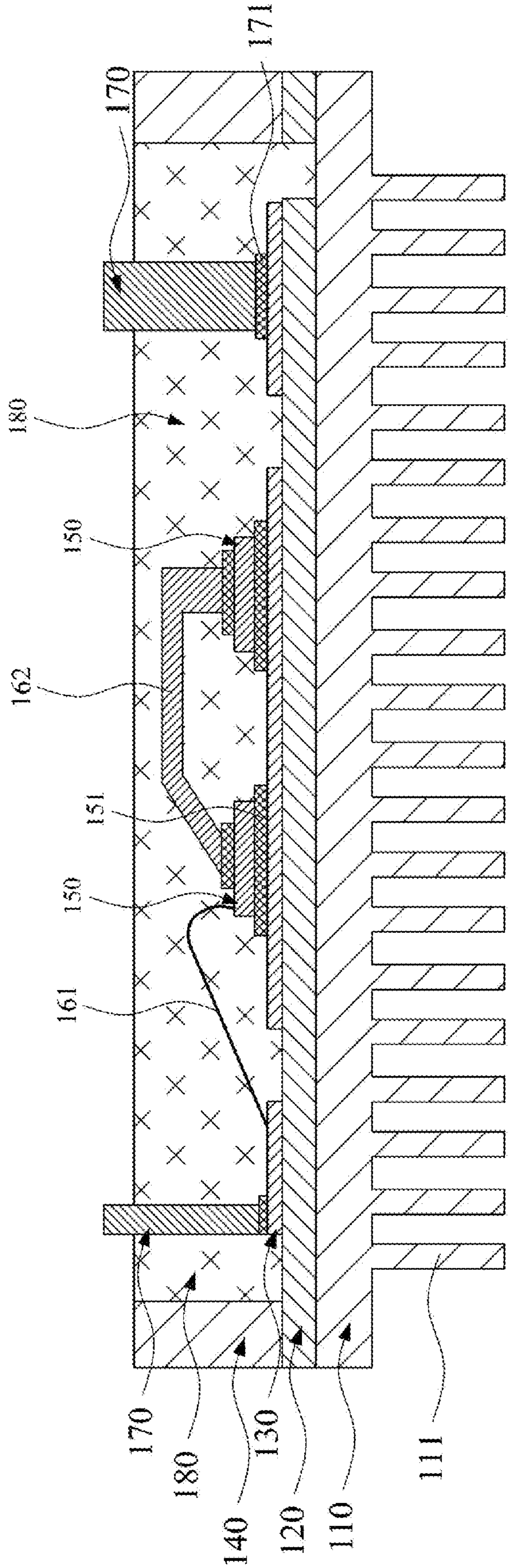
FIG. 1 is a cross-sectional view of a semiconductor package according to an embodiment of the present invention.

Hereinafter, embodiments of the present invention will be described in more detail with reference to the accompanying drawings.

A semiconductor package according to an embodiment of the present invention includes a heat radiation substrate 110, one or more insulating layers 120 disposed on the heat radiation substrate 110, one or more metal pattern layers 130 disposed on the insulating layers 120, a housing 140 disposed on the insulating layer 120, one or more semiconductor chips 150 installed on the metal patter layers 130, electrically connecting members 161 and 162 for electrical connection between the metal pattern layers 130 and the semiconductor chips 150 or between each of a plurality of semiconductor chips 150, if the semiconductor chip 150 is in a plural number, one or more terminals 170 formed uprightly on the metal pattern layers 130, and a molding sealing member 180 molded to cover the semiconductor chips 150, the electrically connecting members 161 and 162, and at least a part of the terminals 170. Here, a thickness of the housing 140 is greater than a thickness of the metal pattern layer 130 and at least one terminal 170 is formed to be higher than the upper end surface of the housing 140. Accordingly, the upper ends of the at least one terminal 170 are exposed to the upper part of the molding sealing member 180 and thereby, may be electrically bonded to external electrical connecting members. Then, the heat radiation substrate 110 and the housing 140 are separately formed and bonded to each other so as to improve productivity.

Hereinafter, the semiconductor package described above will be described in more detail with reference to FIG. 1.

First, the heat radiation substrate 110 is formed of a metal material and referring to FIG. 1, post-formed radiation fins 111 formed uprightly on the bottom surface of the heat radiation substrate 110 may be arranged in a specific pattern.

Also, the heat radiation substrate 110 may be formed of a single material including Al or Cu having excellent electrical conductivity or thermal conductivity or an alloy material containing 50% or more of any one of Al and Cu.

In addition, more than 30% of the total surface area of the heat radiation substrate 110 is plated and thus, electrical conductivity or thermal conductivity may be improved.

Moreover, the radiation fins 111 are structurally bonded onto the lower part of the heat radiation substrate 110 so that heat conducted to the heat radiation substrate 110 may be radiated to the outside and thereby, operating reliability of the semiconductor chips 150 may be secured.

Here, the radiation fins 111 may be formed in various forms such as a circular columns, an elliptic cylinder, or a polygonal columns. Also, the heat radiation substrate 110 is masked by a screen mask or a stencil mask, a metal paste or a non-metal paste is directly printed on the masked heat radiation substrate 110, and then, the heat radiation substrate 110 is hardened. Accordingly, the heat radiation substrate 110 and the radiation fins 111 may be directly bonded to each other without a separate adhesive layer to form a bonding structure.

Also, the radiation fins 111 may be formed of a metal having excellent thermal conductivity or may contain 40% or more of a metal component having excellent thermal conductivity. The radiation fins 111 may be formed of a material that is same as that of the heat radiation substrate 110.

Figure 5:
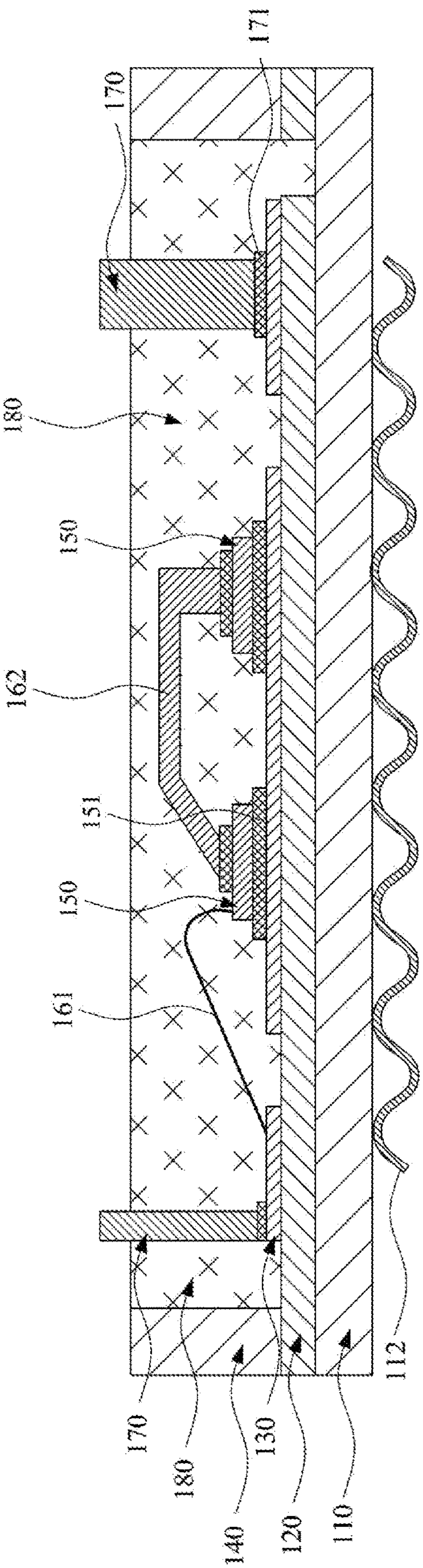
FIG. 5 illustrates a modification example of the semiconductor package of FIGS. 1 and 2.

In addition, referring to FIG. 5, one or more wave-formed metal plates 112 are structurally bonded to the lower surface of the heat radiation substrate 110 by using ultrasonic welding so that heat conducted to the heat radiation substrate 110 may be radiated to the outside and thus, operating reliability of the semiconductor chips 150 may be secured.

Figure 3A:
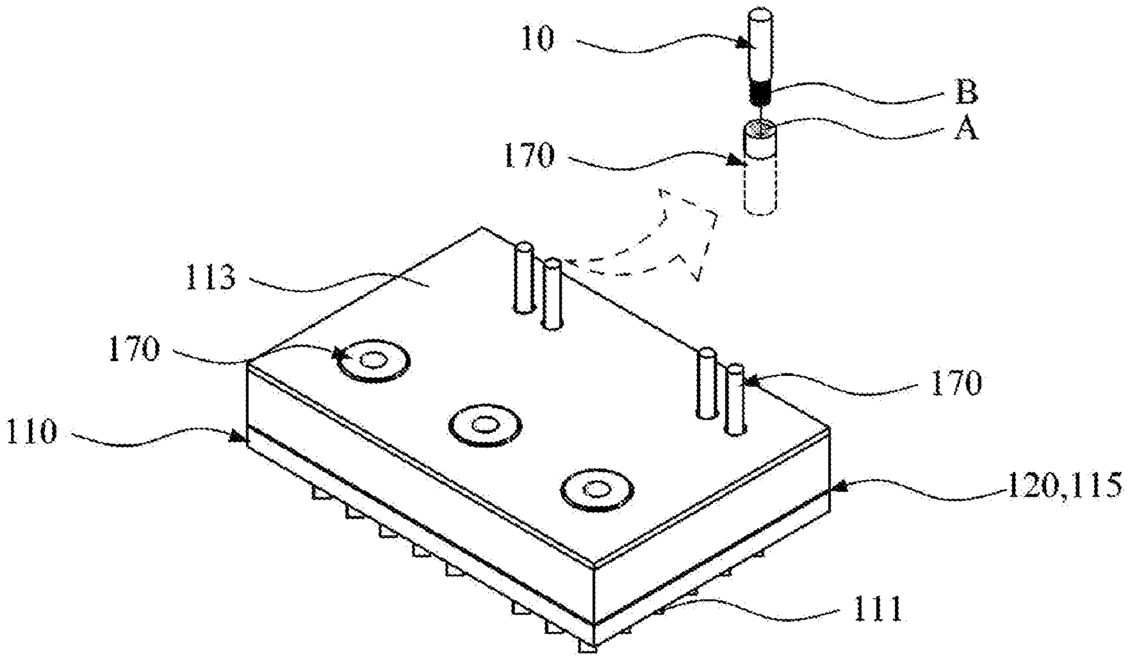
FIGS. 3A and 3B are perspective views of the semiconductor packages of FIG. 1 and FIG. 2.
Figure 3B:
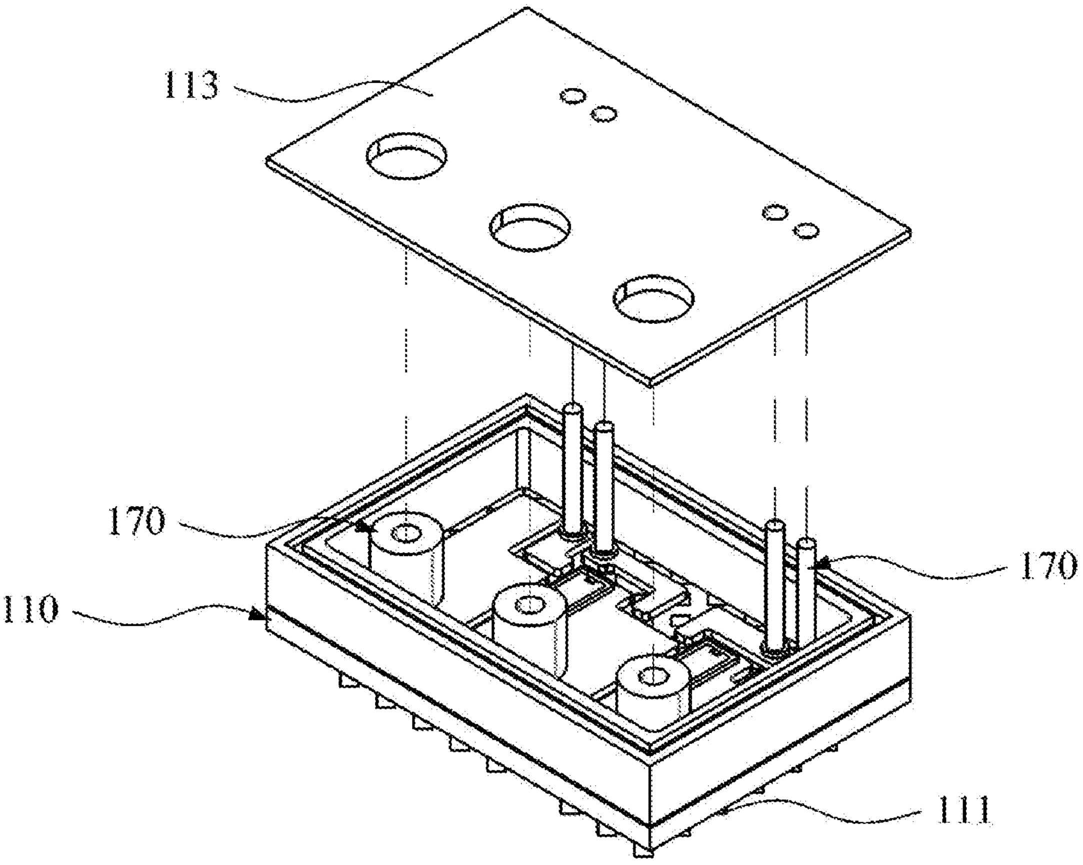
Figure 4:
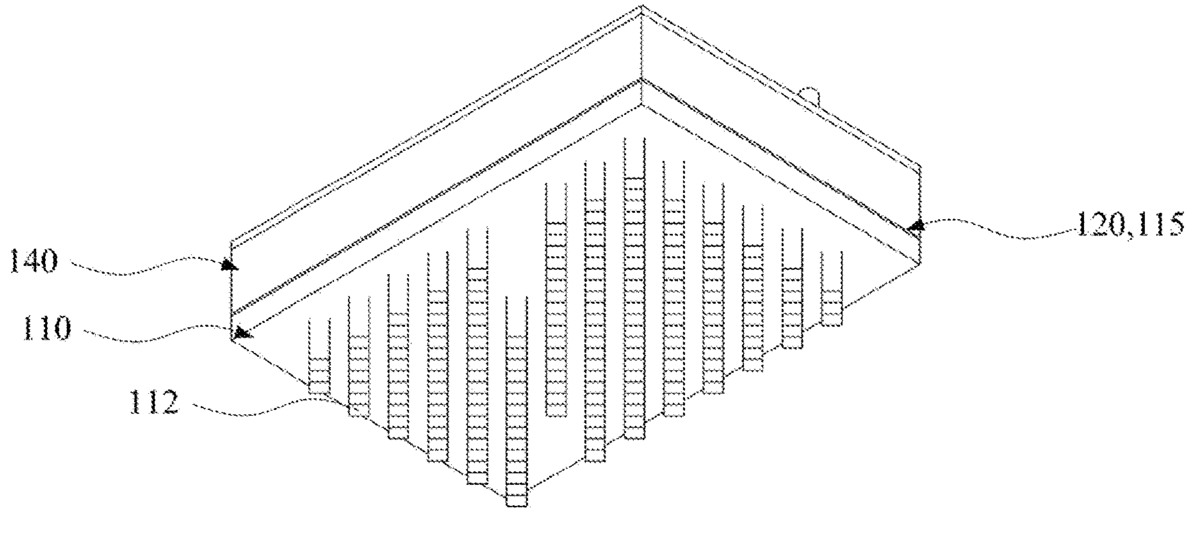
FIG. 4 is another perspective view of the semiconductor package of FIGS. 3A and 3B.

Moreover, referring to FIGS. 3A and 3B, a cover 113 covering more than 50% of the total area of the molding sealing member 180 is formed on the upper part of the heat radiation substrate 110 so as to prevent the molding sealing member 180 from being damaged. Also, the terminals 170 penetrate the cover 113 and are exposed to the upper end so as to be electrically connected to the external electrical connecting members.

Next, one or more insulating layers 120 are formed on the heat radiation substrate 110 and one or more metal layer (not illustrated) may be formed on the lower surface of the insulating layers 120.

Also, the insulating layers 120 may be formed of a single material including $Al_2O_3$, AlN, $Si_3N_4$, or SiC or a composite material including any one of $Al_2O_3$, AlN, $Si_3N_4$, and SiC.

On the other hand, the heat radiation substrate 110 and the insulating layer 120 may include an adhesive member (not illustrated) interposed therebetween and may be bonded to each other. Here, the adhesive member may be formed of a soldering material containing Sn or a conductive material containing 50% or more of any one of Ag and Cu.

Also, the insulating layers 120 may be disposed on the heat radiation substrate 110 in a paste or film form and may be hardened on the heat radiation substrate 110 through a hardening process to have a certain thickness.

Next, one or more metal pattern layers 130 are disposed on the insulating layers 120 and are electrically connected to the semiconductor chips 150.

Here, a thickness of the metal pattern layers 130 may be in the range of 0.1 mm to 5 mm.

Next, the housing 140 is disposed on the insulating layers 120 and is filled with the molding sealing member 180.

The housing 140 may be formed of a metal material. Accordingly, heat radiation may be available through the heat radiation substrate 110 formed of a metal material and heat radiation may be also available through the housing 140 covering the sides of the semiconductor package. Therefore, heat radiation performance may be improved.

Also, the insulating layers 120 formed on the lower surface of the housing 140 and the lower surface of the metal pattern layers 130 may be formed of the same material and a thickness of the housing 140 may be greater than a thickness of the metal pattern layers 130.

Next, one or more semiconductor chips 150 may be installed on the metal pattern layers 130 by using adhesive layers 151 interposed therebetween and may be applied to devices such as an inverter, a converter, or an On Board Charger (OBC) used to convert or control power by using an Insulated Gate Bipolar Transistor (IGBT) or a Metal-Oxide-Semiconductor Field-Effect Transistor (MOSFET) which is a power semiconductor chip having a power conversion function.

Next, the electrically connecting members 161 and 162 are used to electrically connect the metal pattern layers 130 to the semiconductor chips 150 in such a way that the metal pattern layers 130 and the semiconductor chips 150 and/or the semiconductor chips 150 may be electrically connected to each other. Here, the electrically connecting members 161 and 162 may respectively be a wire and a surface-joint type conductive clip.

Also, the electrically connecting members 161 and 162 may be formed of a material (metal material) containing 50% or more of any one of Au, Al, and Cu having excellent electrical conductivity.

Next, one or more terminals 170 are uprightly formed on the metal pattern layers 130 in the form of posts by using adhesive layers 171 interposed therebetween and are extended from the metal pattern layers 130 to be exposed to the outside so that an electric signal may be applied from the outside.

Here, at least one terminal 170 is formed to be higher than the upper end surface of the housing 140. Accordingly, the upper ends of the at least one terminal 170 are exposed to the upper part of the molding sealing member 180 and thereby, may be electrically bonded to the external electrical connecting members.

Referring to FIG. 3A, the upper ends of one or more terminals 170 may be formed as a female screw A and the external electrical connecting members 10 may be formed as a male screw B which are bolt-joined to the upper ends of the terminals 170. Accordingly, the terminals 170 in the form of the female screw A and the external electrical connecting members 10 in the form of the male screw B may be joined and electrically connected to each other.

Also, although not illustrated, the ends of one or more terminals 170 are formed to join a press fit pin terminal and thereby, are pressurized so as to be electrically connected to the external electrical connecting members.

Next, the molding sealing member 180 is molded to cover the semiconductor chips 150, the electrically connecting members 161 and 162, and at least part of the terminals 170.

Here, EMC, PBT, or PPS is used to form the molding sealing member 180 and to fill the housing 140. The molding sealing member 180 is molded to cover and insulate the semiconductor chips 150, the electrically connecting members 161 and 162, and at least part of the terminals 170 and to cover and protect a part of an inner circuit.

Preferably, the molding sealing member 180 may be a composite material containing an epoxy component or an insulator containing a Si component and a thickness of the molding sealing member 180 may be 1 mm or above.

The housing 140 formed of a metal material is formed to cover the sides of the molding sealing member 180 and has a structure in which the upper end thereof is opened so that whether the molding sealing member 180 included in the housing 140 is properly filled may be clearly viewed and stability of molding may be secured.

Figure 6A:
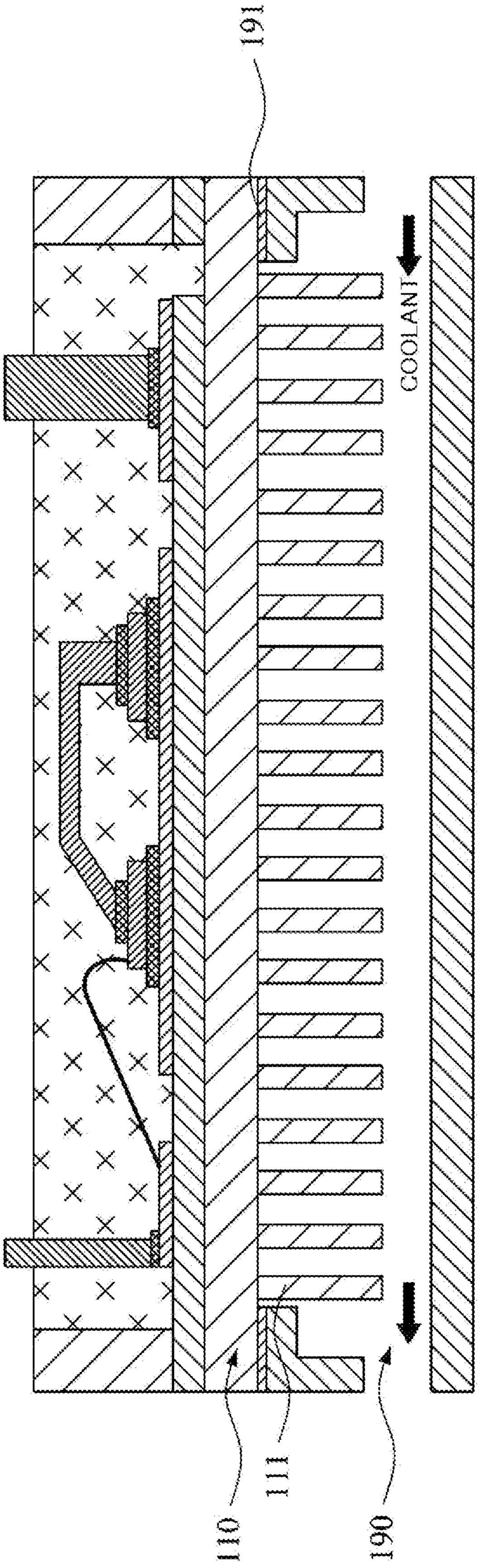
FIGS. 6A and 6B respectively illustrate a bonding structure between the semiconductor packages of FIG. 1 and FIG. 2 and a cooling system.

Also, referring to FIG. 6A, a cooling system 190 is structurally joined to the heat radiation substrate 110 and a substrate bonding member 191 formed of an oil ring or an adhesive for a water-tight coolant is formed on a joined surface between the lower part of the heat radiation substrate 110 and the upper part of the cooling system 190. Accordingly, the radiation fins 111 may be cooled by the coolant and thereby, heat radiation efficiency may be improved.

Figure 6B:
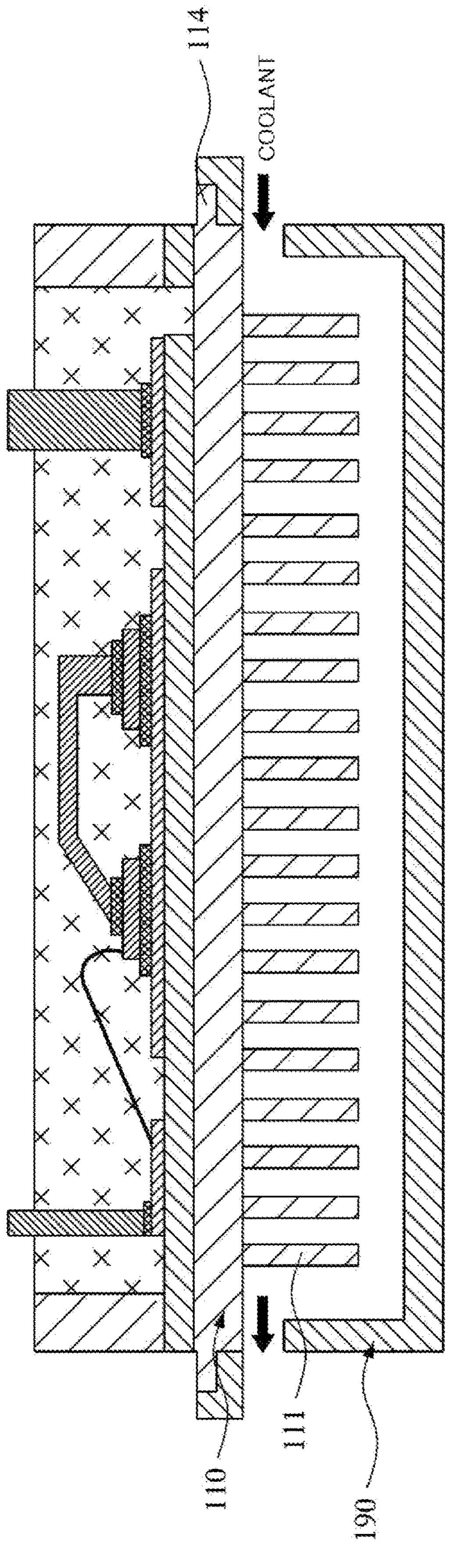

In addition, referring to FIG. 6B, the cooling system 190 is structurally joined to the heat radiation substrate 110, and the lower part of the heat radiation substrate 110 and an upper groove of the cooling system 190 are bonded to each other at a lower skirt 114 of the heat radiation substrate 110 by using friction stir welding (FSW). Accordingly, a coolant of the cooling system 190 may be water-tight and thereby, the radiation fins 111 may be cooled by the coolant so as to improve heat radiation efficiency.

Here, the coolant may directly contact the radiation fins 111 so that an area contacting the coolant may be enlarged to improve heat radiation efficiency. The coolant may include cooling water, a coolant fluid, refrigerant gas, or air, however, the present invention is not limited thereto. The coolant may include all types of refrigerant and a cooling method may include water cooling or air cooling.

On the other hand, a semiconductor package according to another embodiment of the present invention will be described in more detail below with reference to FIG. 2.

Figure 2:
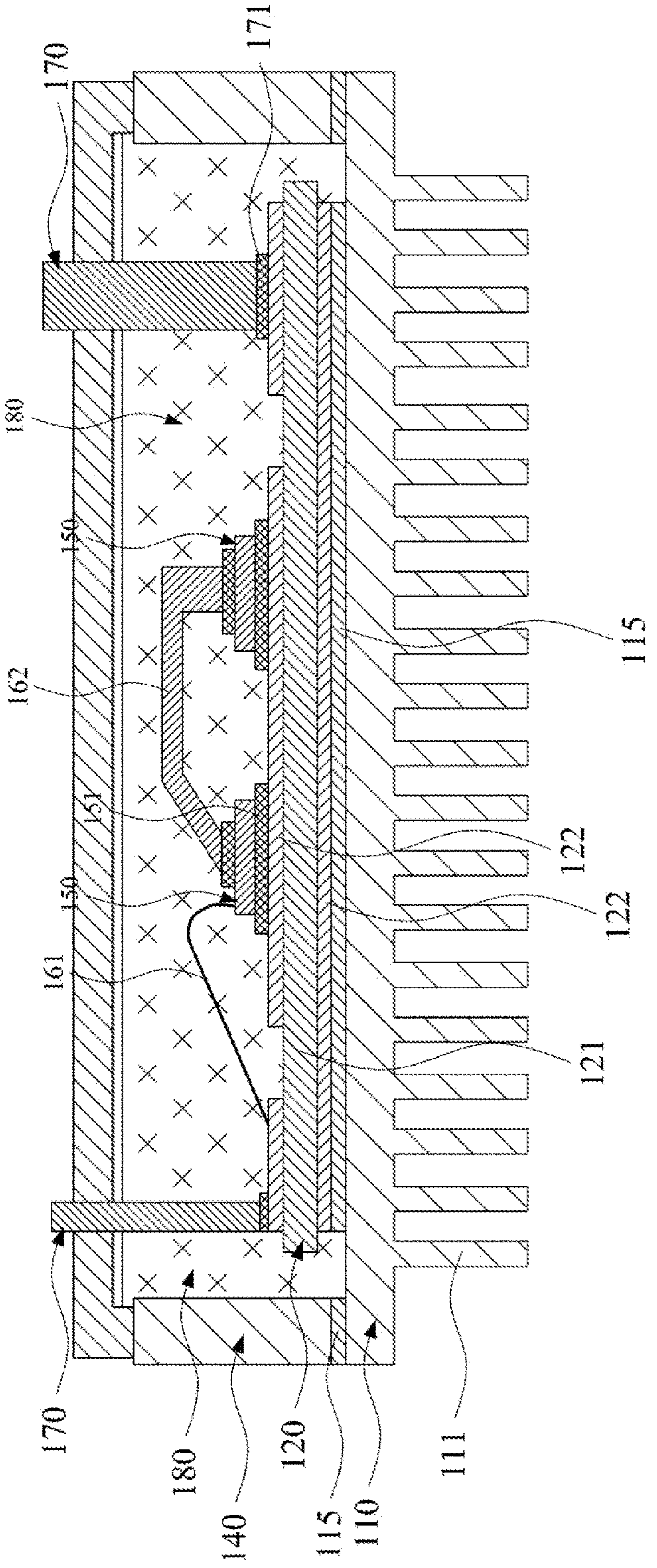
FIG. 2 is a cross-section view of a semiconductor package according to another embodiment of the present invention.

First, the heat radiation substrate 110 is formed of a metal material and referring to FIG. 2, the post-formed radiation fins 111 formed uprightly on the bottom surface of the heat radiation substrate 110 may be arranged in a specific pattern Also, the heat radiation substrate 110 may be formed of a single material including Al or Cu having excellent electrical conductivity or thermal conductivity or an alloy material containing 50% or more of any one of and Cu.

In addition, more than 30% of the total surface area of the heat radiation substrate 110 is plated and thus, electrical conductivity or thermal conductivity may be improved.

Moreover, the radiation fins 111 are structurally bonded onto the lower part of the heat radiation substrate 110 so that heat conducted to the heat radiation substrate 110 may be radiated to the outside and thereby, operating reliability of the semiconductor chips 150 may be secured.

Here, the radiation fins 111 may be formed in various forms such as a circular columns, an elliptic cylinder, or a polygonal columns. Also, the heat radiation substrate 110 is masked by a screen mask or a stencil mask, a metal paste or a non-metal paste is directly printed on the masked heat radiation substrate 110, and then, the heat radiation substrate 110 is hardened. Accordingly, the heat radiation substrate 110 and the radiation fins 111 may be directly bonded to each other without a separate adhesive layer to form a bonding structure.

Also, the radiation fins 111 may be formed of a metal having excellent thermal conductivity or may contain 40% or more of a metal component having excellent thermal conductivity. The radiation fins 111 may be formed of a material that is same as that of the heat radiation substrate 110.

In addition, as in FIG. 5, one or more wave-formed metal plates 112 are structurally bonded to the lower surface of the heat radiation substrate 110 by using ultrasonic welding so that heat conducted to the heat radiation substrate 110 may be radiated to the outside and thus, operating reliability of the semiconductor chips 150 may be secured.

Moreover, referring to FIGS. 3A and 3B, the cover 113 covering more than 50% of the total area of the molding sealing member 180 is formed on the upper part of the heat radiation substrate 110 so as to prevent the molding sealing member 180 from being damaged. Also, the terminals 170 penetrate the cover 113 and are exposed to the upper end so as to be electrically connected to the external electrical connecting members.

Next, an adhesive member 115 is disposed on the heat radiation substrate 110 so that the heat radiation substrate 110, an insulating substrate 120, and the housing 140 are bonded to each other.

More specifically, a second adhesive member may be disposed at an outer edge (second region) of the heat radiation substrate 110 and a first adhesive member may be disposed on an inner region (first region) surrounded by the outer edge (second region).

Here, the adhesive member 115 may be formed of a soldering or sintering material containing a metal component. For example, the adhesive member 115 may be formed of a soldering material containing Sn or a conductive material containing 50% or more of any one of Ag and Cu.

Next, the insulating substrate 120 including one or more insulating layers 121 may be disposed on the adhesive member 115 and may be formed of one or more insulating layers 121 and one or more metal layers 122 formed on the upper surface and/or the lower surface of the insulating layer 121.

Also, the insulating layer 121 may be formed of a single material including $Al_2O_3$, AlN, $Si_3N_4$, or SiC or a composite material including any one of $Al_2O_3$, AlN, $Si_3N_4$, and SiC.

Next, the housing 140 is disposed on the adhesive member 115 and is filled with the molding sealing member 180. The housing 140 may be formed of a metal material. In this regard, heat radiation may be available through the heat radiation substrate 110 formed of a metal material and heat radiation may be also available through the housing 140 covering the sides of the semiconductor package. Therefore, heat radiation performance may be improved.

Here, a thickness of the housing 140 may be greater than a thickness of the insulating substrate 120.

Next, one or more semiconductor chips 150 may be installed on the insulating substrate 120 by using the adhesive layers 151 interposed therebetween and may be applied to devices such as an inverter, a converter, or an OBC used to convert or control power by using an IGBT or a MOSFET which is a power semiconductor chip having a power conversion function.

Next, the electrically connecting members 161 and 162 are used to electrically connect the semiconductor chips 150 in such a way that the metal layers 122 formed on the upper part of the insulating substrate 120 and the semiconductor chips 150 and/or the semiconductor chips 150 may be electrically connected to each other. Here, the electrically connecting members 161 and 162 may respectively be a wire and a surface-joint type conductive clip.

Also, the electrically connecting members 161 and 162 may be formed of a material (metal material) containing 50% or more of any one of Au, Al, and Cu having excellent electrical conductivity.

Next, one or more terminals 170 are uprightly formed on the insulating substrate 120 in the form of posts by using the adhesive layers 171 interposed therebetween and are extended from the molding sealing member 180 to be exposed to the outside so that an electric signal may be applied from the outside.

Here, at least one terminal 170 is formed to be higher than the upper end surface of the housing 140. Accordingly, the upper ends of one or more terminals 170 are exposed to the upper part of the molding sealing member 180 and thereby, may be electrically bonded to the external electrical connecting members.

Referring to FIG. 3A, the upper ends of one or more terminals 170 may be formed as a female screw A and the external electrical connecting members 10 may be formed as a male screw B which are bolt-joined to the upper ends of the terminals 170. Accordingly, the terminals 170 in the form of the female screw A and the external electrical connecting members 10 in the form of the male screw B may be joined and electrically connected to each other.

Also, although not illustrated, the ends of one or more terminals 170 are formed to join a press fit pin terminal and thereby, are pressurized so as to be electrically connected to the external electrical connecting members.

Next, the molding sealing member 180 is molded to cover the semiconductor chips 150, the electrically connecting members 161 and 162, and at least part of the terminals 170.

Here, EMC, PBT, or PPS is used to form the molding sealing member 180 and to fill the housing 140. The molding sealing member 180 is molded to cover and insulate the semiconductor chips 150, the electrically connecting members 161 and 162, and at least part of the terminals 170 and to cover and protect a part of an inner circuit.

Preferably, the molding sealing member 180 may be a composite material containing an epoxy component or an insulator containing a Si component and a thickness of the molding sealing member 180 may be 1 mm or above.

The housing 140 formed of a metal material is formed to cover the sides of the molding sealing member 180 and has a structure in which the upper end thereof is opened so that whether the molding sealing member 180 included in the housing 140 is properly filled may be clearly viewed and stability of molding may be secured.

Also, as illustrated in FIG. 6A described above, the cooling system 190 is structurally joined to the heat radiation substrate 110 and the substrate bonding member 191 formed of an oil ring or an adhesive for a water-tight coolant is formed on a joined surface between the lower part of the heat radiation substrate 110 and the upper part of the cooling system 190. Accordingly, the radiation fins 111 may be cooled by the coolant and thereby, heat radiation efficiency may be improved.

In addition, as illustrated in FIG. 6B described above, the cooling system 190 is structurally joined to the heat radiation substrate 110, and the lower part of the heat radiation substrate 110 and an upper groove of the cooling system 190 are bonded to each other at the lower skirt 114 of the heat radiation substrate 110 by using FSW. Accordingly, a coolant of the cooling system 190 may be water-tight and thereby, the radiation fins 111 may be cooled by the coolant so as to improve heat radiation efficiency.

Here, the coolant may directly contact the radiation fins 111 so that an area contacting the coolant may be enlarged to improve heat radiation efficiency. The coolant may include cooling water, a coolant fluid, refrigerant gas, or air, however, the present invention is not limited thereto. The coolant may include all types of refrigerant and a cooling method may include water cooling or air cooling.

According to the semiconductor package and a method of manufacturing the same described above, the heat radiation substrate and the housing may be separately formed and are bonded to each other through the insulating layer or the adhesive member so that a manufacturing process thereof is suitable for mass-production and thereby, productivity may be increased. Also, a molding resin may not flow over the outside of the heat radiation substrate by the housing having a certain height so that the substrate may be prevented from being contaminated.

According to the present invention, the heat radiation substrate and the housing may be separately formed and are bonded to each other through the insulating layer or the adhesive member so that a manufacturing process thereof is suitable for mass-production and thereby, productivity may be increased. Also, a molding resin may not flow over the outside of the heat radiation substrate by the housing having a certain height so that the substrate may be prevented from being contaminated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:

a heat radiation substrate;

an insulating layer disposed on the heat radiation substrate, wherein the insulating layer is in direct contact with the heat radiation substrate;

a metal pattern layer disposed on the insulating layer;

a housing disposed on the insulating layer, wherein the housing is in direct contact with the insulating layer, wherein the housing is formed of a metal material for additional heat dissipation;

a pair of semiconductor chips bonded to an upper surface of the metal pattern layer, the pair of semiconductor chips being connected to each other with a clip;

a wire connecting the metal pattern layer to one of the semiconductor chips;

first and second vertical terminals bonded to the upper surface of the metal pattern layer; and a molding sealing member molded to cover the semiconductor chips, the wire, and at least a part of the terminals, wherein a thickness of the housing is greater than a thickness of the metal pattern layer and the terminals are formed to be higher than an upper end surface of the housing so that upper ends of the terminals are exposed to an upper part of the molding sealing member and are electrically bonded to external electrical connecting members, wherein the upper end surface of the housing is flushed with an upper end surface of the molding sealing member, wherein the pair of semiconductor chips are located between the first and second vertical terminals, wherein horizontal widths of the first and second vertical terminals are different from each other.

2. The semiconductor package of claim 1, wherein the heat radiation substrate is formed of a metal material and radiation fins are arranged on a bottom surface of the heat radiation substrate in a specific pattern.

3. The semiconductor package of claim 1, wherein the heat radiation substrate or the housing is formed of a single material comprising Al or Cu or an alloy material containing 50% or more of any one of Al and Cu.

4. The semiconductor package of claim 1, wherein more than 30% of a total surface area of the heat radiation substrate is plated.

5. The semiconductor package of claim 1, wherein the insulating layer comprises one or more metal layers.

6. The semiconductor package of claim 1, wherein the insulating layer is disposed on the heat radiation substrate in a paste or film form and is hardened on the heat radiation substrate through a hardening process.

7. The semiconductor package of claim 1, wherein the wire is formed of a material containing 50% or more of any one of Au, Al, and Cu.

8. The semiconductor package of claim 1, wherein the molding sealing member is a composite material containing an epoxy component or an insulator containing a Si component.

9. The semiconductor package of claim 1, wherein the upper ends of the terminals are formed as a female screw and the external electrical connecting members are formed as a male screw which are bolt-joined to the upper ends of the terminals so that the terminals and the external electrical connecting members are electrically connected to each other.

10. The semiconductor package of claim 1, wherein the ends of the terminals are formed to join a press fit pin terminal and are electrically connected to the external electrical connecting members.

11. The semiconductor package of claim 1, wherein one or more wave-formed metal plates are structurally bonded to a bottom surface of the heat radiation substrate.

12. The semiconductor package of claim 1, wherein the heat radiation substrate comprises a cover covering more than 50% of a total area of the molding sealing member.

13. The semiconductor package of claim 1, wherein the heat radiation substrate comprises a cooling system structurally joined thereto and a substrate bonding member used for a water-tight coolant is formed on a joined surface between the heat radiation substrate and the cooling system.

14. The semiconductor package of claim 1, wherein the heat radiation substrate comprises a cooling system structurally joined thereto, and the heat radiation substrate and the cooling system are bonded to each other by using friction stir welding (FSW) so that a coolant of the cooling system is water-tight.

15. The semiconductor package of claim 1, wherein the heat radiation substrate is formed of a metal material, the housing is formed to cover sides of the molding sealing member and has a structure in which the upper part thereof is opened, and a cover comprising penetration holes thereon to expose the terminals is prepared on the upper part of the heat radiation substrate so as to cover the molding sealing member and to be bonded to the upper part of the housing.

* * * * *